US012598955B2

(12) United States Patent (10) Patent No.: US 12,598,955 B2
Song et al. (45) Date of Patent: Apr. 7, 2026

(54) SUBSTRATE TRANSFER DEVICE AND SUBSTRATE PROCESSING APPARATUS HAVING THE SAME

(71) Applicant: EUGENE TECHNOLOGY CO., LTD., Yongin-Si (KR)

(72) Inventors: Byoung Gyu Song, Yongin-si (KR); Hyeong Sik Ko, Seoul (KR); Hyeong Hwan Bae, Seongnam-si (KR); Jun Jin Hyon, Gunpo-si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 1035 days.

(21) Appl. No.: 17/717,026

(22) Filed: Apr. 8, 2022

(65) Prior Publication Data

US 2022/0328340 A1    Oct. 13, 2022

(30) Foreign Application Priority Data

Apr. 12, 2021    (KR) ........................ 10-2021-0047251

(51) Int. Cl.
*H10P 72/76* (2026.01)
*H10P 72/00* (2026.01)
(Continued)

(52) U.S. Cl.
CPC ...... *H10P 72/7602* (2026.01); *H10P 72/0606* (2026.01); *H10P 72/3302* (2026.01); *H10P 72/53* (2026.01)

(58) Field of Classification Search
CPC ......... H01L 21/68707; H01L 21/67259; H01L 21/67742; H01L 21/681; H01L 21/67766; H01L 21/67781; H01L 21/67288; B25J 9/1692; B25J 11/0095; B25J 15/0014; B25J 15/0052; B25J 19/021; H10P 72/7602;
(Continued)

(56) References Cited

U.S. PATENT DOCUMENTS 5,319,216 A * 6/1994 Mokuo .................... G01V 8/20
250/559.4
5,565,034 A * 10/1996 Nanbu .............. H01L 21/67265
118/712

(Continued)

FOREIGN PATENT DOCUMENTS

CN    102903657 A    1/2013
JP    H06246658 A    9/1994
(Continued)

*Primary Examiner* — Stephen A Vu
(74) *Attorney, Agent, or Firm* — Renaissance IP Law Group LLP

(57) ABSTRACT

The present disclosure relates to a substrate transfer device for sensing deflection of an end-effector and a substrate processing apparatus having the same. The substrate transfer device includes: an end-effector extending in a first direction and supporting a substrate; an end-effector hand connected with one side in the first direction of the end-effector; a horizontal movement unit connected with the end-effector hand and moving the end-effector in the first direction; and a deflection sensing unit including a light emitting part and a light receiving part, which are respectively disposed at both sides of a movement path of the end-effector, and sensing deflection of the end-effector.

12 Claims, 7 Drawing Sheets

(51) Int. Cl.
    *H10P 72/30*          (2026.01)
    *H10P 72/50*          (2026.01)

(58) Field of Classification Search
    CPC .. H10P 72/0606; H10P 72/3302; H10P 72/53;
          H10P 72/3402; H10P 72/3412; H10P
                                            72/0616
    See application file for complete search history.

(56)              References Cited

U.S. PATENT DOCUMENTS

| | | | |
|---|---|---|---|
| 5,906,469 A | 5/1999 | Oka et al. | |
| 9,254,566 B2 * | 2/2016 | Hashimoto | .............. B25J 9/042 |
| 2001/0009641 A1 * | 7/2001 | Haraguchi | ........ H01L 21/67772 |
| | | | 414/217 |
| 2008/0232937 A1 * | 9/2008 | Abe | .................. H01L 21/67766 |
| | | | 414/222.02 |
| 2017/0125279 A1 * | 5/2017 | Kirino | .............. H01L 21/67766 |

FOREIGN PATENT DOCUMENTS

| | | | |
|---|---|---|---|
| JP | 2004296484 | A | 10/2004 |
| JP | 2008235841 | A | 10/2008 |
| JP | 2015167250 | A | 9/2015 |
| JP | 2017085015 | A | 5/2017 |
| KR | 20040005311 | A | 1/2004 |
| KR | 20060037815 | A | 5/2006 |
| KR | 20070027295 | A | 3/2007 |
| KR | 20080086838 | A | 9/2008 |
| KR | 20100090716 | A | 8/2010 |
| KR | 101420814 | B1 | 7/2014 |
| KR | 20200130058 | A | 11/2020 |
| TW | 201320226 | A | 5/2013 |
| TW | M610289 | U | 4/2021 |
| WO | 9938207 | A1 | 7/1999 |
| WO | 2004061942 | A1 | 7/2004 |

* cited by examiner (a)

(b)

(c)

(d)

(a)

(b)

SUBSTRATE TRANSFER DEVICE AND SUBSTRATE PROCESSING APPARATUS HAVING THE SAME

CROSS-REFERENCE TO RELATED APPLICATION

This application claims priority to Korean Patent Application No. 10-2021-0047251 filed on Apr. 12, 2021, and all the benefits accruing therefrom under 35 U.S.C. § 119, the contents of which are incorporated by reference in their entirety.

BACKGROUND

The present disclosure relates to a substrate transfer device and a substrate processing apparatus having the same, and more particularly, to a substrate transfer device for sensing deflection of an end-effector and a substrate processing apparatus having the same.

In order to perform a unit process in a semiconductor manufacturing process, a plurality of apparatuses suitable for characteristics of each process are required, and each of the apparatuses includes a substrate transfer device for transferring a substrate.

In general, the substrate transfer device of the semiconductor apparatus serves to transfer a substrate from a load-lock chamber to a substrate storage member (e.g., FOUP, a carrier, etc.) or from the substrate storage member to the load-lock chamber.

A batch-type substrate processing apparatus performs a substrate processing process on a plurality of substrates after stacking the plurality of substrates in a substrate boat in multiple stages from the load-lock chamber. Here, the substrate transfer device may have two or more end-effectors to reduce a transfer time (e.g., stacking time) of the substrate, and take out two or more substrates at once from the substrate storage member and stacking the substrates in the substrate boat.

While the substrate transfer device is used, deflection of each of the end-effectors may be generated. When a pitch between the plurality of end-effectors is changed according to the deflection of the end-effector, damage such as scratch may be generated on the substrate while the substrate enters the substrate boat or the substrate storage member, or a big accident such as falling of the substrate boat may occur.

Thus, a technology for sensing the deflection of the end-effectors and determining abnormality of the pitch between the plurality of end-effectors is required in order to solve the above-described limitations.

SUMMARY

The present disclosure provides a substrate transfer device for sensing deflection of an end-effector to prevent a substrate transfer failure and a substrate processing apparatus having the same.

In accordance with an exemplary embodiment, a substrate transfer device includes: an end-effector extending in a first direction and configured to support a substrate; an end-effector hand connected with one side in the first direction of the end-effector; a horizontal movement unit connected with the end-effector hand and configured to move the end-effector in the first direction; and a deflection sensing unit including a light emitting part and a light receiving part, which are respectively disposed at both sides of a movement path of the end-effector, and configured to sense deflection of the end-effector.

A plurality of end-effectors may be provided and arranged in multiple stages, and the light emitting part may include a plurality of light sources corresponding to the plurality of end-effectors.

The substrate transfer device may further include a pitch adjustment unit connected with the end-effector hand and configured to adjust a pitch of the plurality of end-effectors.

The deflection sensing unit may further include: a light quantity measurement part configured to measure a light quantity received by the light receiving part; and an abnormality determination part configured to determine abnormality of a pitch of the plurality of end-effectors based on the measured light quantity.

The horizontal movement unit may include a support plate extending in the first direction to provide the movement path of the end-effector caused by running of the end-effector hand, and the light emitting part and the light receiving part may be respectively supported by both sides in a second direction crossing the first direction of the support plate.

The substrate transfer device may further include a rotation driving unit connected with the support plate to rotate the support plate around a rotation axis.

The substrate transfer device may further include an elevation unit including an elevation shaft provided at one side in the first direction of the support plate to elevate the rotation driving unit along the elevation shaft, and the rotation shaft may be spaced from the elevation shaft to the other side in the first direction.

The light emitting part and the light receiving part may be disposed from a central portion of the support plate to the other side opposite to one side in the first direction of the support plate.

The deflection sensing unit may further include a position adjustment part configured to adjust a position of at least one of the light emitting part and the light receiving part.

The deflection sensing unit may further include an irradiation angle adjustment part configured to adjust an irradiation angle of the light emitting part.

The light emitting part may irradiate straight light having a minimum distance from a bottom surface of the end-effector in a horizontal state, which is 20% or more of a thickness of the end-effector.

In accordance with another exemplary embodiment, a substrate processing apparatus includes: the substrate transfer device in accordance with an exemplary embodiment; a substrate boat in which the substrates supported by the end-effector are transferred and stacked in multiple stages; and a process tube having an inner space in which the substrate boat is accommodated.

The substrate transfer device may be disposed between a substrate storage member in which the plurality of substrates are accommodated and the substrate boat to transfer the substrates between the substrate storage member and the substrate boat.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
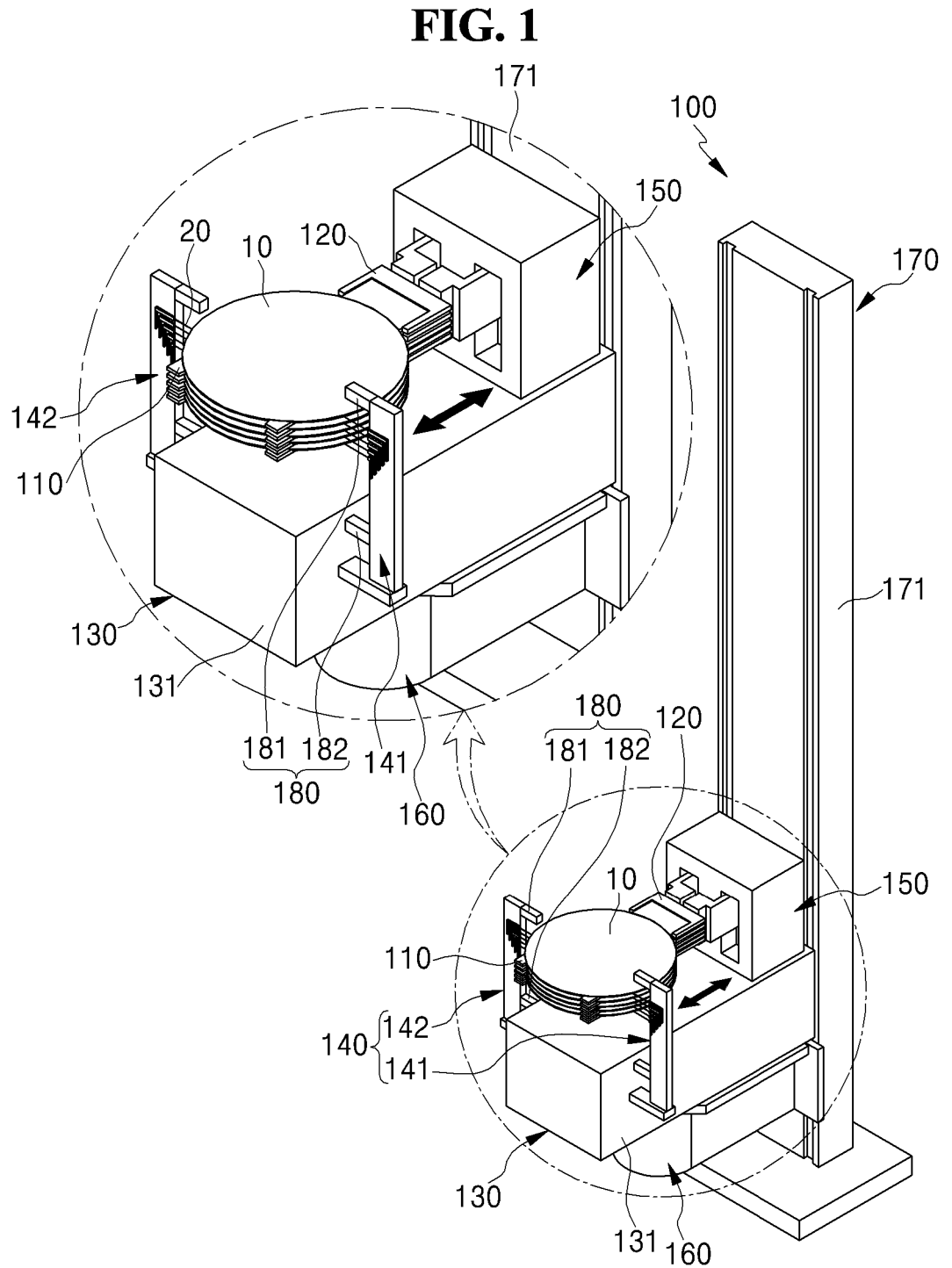
FIG. 1 is a view illustrating a substrate transfer device in accordance with an exemplary embodiment.

Hereinafter, exemplary embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In every possible case, like reference numerals are used for referring to the same or similar elements in the description and drawings. In the figures, the dimensions of layers and regions are exaggerated for clarity of illustration. Like reference numerals in the drawings denote like elements, and thus their description will be omitted.

FIG. 1 is a view illustrating a substrate transfer device in accordance with an exemplary embodiment.

Referring to FIG. 1, a substrate transfer device 100 in accordance with an exemplary embodiment may include: an end-effector 110 extending in a first direction and supporting a substrate 10; an end-effector hand 120 connected to one side of the end-effector 110 in the first direction; a horizontal movement unit 130 connected to the end-effector hand 120 and moving the end-effector 110 in the first direction; and a deflection sensing unit 140 including a light emitting part 141 and a light receiving part 142 respectively disposed at both sides of a movement path of the end-effector 110 and sensing deflection of the end-effector 110.

The end-effector 110 may extend in the first direction and support the substrate 10. For example, the end-effector 110 may have a fork shape and contact a bottom surface of the substrate 10 to support the substrate 10. Also, the end-effector 110 may be made of a ceramic material such as quartz, aluminum oxide ($Al_2O_3$), aluminum nitride (AlN), silicon carbide (SiC), titanium dioxide ($TiO_2$), and silicon dioxide ($SiO_2$). Here, the substrate 10 may be a wafer. However, the exemplary embodiment is not limited thereto. For example, the substrate 10 may be a glass substrate.

The end-effector hand 120 may be connected to the one side of the end-effector 110 in the first direction and fix (or maintain) the end-effector 110 in a horizontal state. For example, the end-effector hand 120 may be made of a material different from that of the end-effector 110, e.g., metal such as aluminum (Al). However, the exemplary embodiment is not limited thereto. Since the end-effector 110 and the end-effector hand 120 are made of different materials, deflection abnormality (or abnormal deflection) of the end-effector 110 may occur due to a crack of the end-effector 110 or loosening of a bolt for coupling the end-effector 110 with the end-effector hand 120.

The horizontal movement unit 130 may be connected to the end-effector hand 120 and move the end-effector 110 in the first direction. For example, the horizontal movement unit 130 may adjust a length of the end-effector hand 120 to move the end-effector 110 in the first direction or move the end-effector 110 together with the end-effector hand 120 in the first direction.

The deflection sensing unit 140 may sense deflection of the end-effector 110 and check (or recognize) abnormality of the end-effector 110 such as transfer failure. When the end-effector 110 is inclined by deflection, the substrate 10 may be damaged such as scratch occurrence as the substrate 10 slides, or the substrate 10 collides with a stepped portion (e.g., a partition plate or a substrate support tip) protruding from an inner surface of a substrate boat 210 even when the substrate 10 is stacked in the substrate boat 210. Also, in a worst case, the end-effector 110 may push the substrate boat 210 to be fallen, thereby causing a big accident. However, in an exemplary embodiment, deflection of the end-effector 110 may be sensed through the deflection sensing unit 140 before the substrate 10 is transferred, and thus abnormality of the end-effector 110 may be recognized to prevent damage of the substrate 10 and/or falling of the substrate boat 210 in advance.

Here, the deflection sensing unit 140 may include the light emitting part 141 and the light receiving part 142 respectively disposed at the both sides of the movement path (the first direction) of the end-effector 110. The light emitting part 141 and the light receiving part 142 may be respectively disposed at the both sides of the movement path of the end-effector 110 moved in the first direction and disposed opposite to each other in a second direction crossing the first direction.

For example, when the light emitting part 141 irradiates straight light 20 toward the light receiving part 142, the deflection abnormality of the end-effector 110 may be determined according to a light receiving state (or whether light is received) of the straight light 20 in the light receiving part 142. In general, the light emitting part 141 and the light receiving part 142 may be disposed at the same height to give and receive the horizontal straight light 20. Here, the straight light 20 may be a thru-beam such as a laser beam or an infrared ray (IR).

That is, the deflection sensing unit 140 may sense the deflection of the end-effector 110 in an optical sensing method through the light emitting part 141 and the light receiving part 142. The deflection of the end-effector 110 may be sensed in an always non-sensing method in which the straight light 20 is blocked by the deflected end-effector and is not received by the light receiving part 142 while the straight light 20 is received by the light receiving part 142 in a normal state. Alternatively, the deflection of the end-effector 110 may be sensed in an always sensing method in which the straight light 20 is received by the light receiving part 142 as the end-effector 110 is deflected while the straight light 20 is blocked by the end-effector 110 that is sensed by the straight light 20 and is not received by the light receiving part 142 in a normal state.

Thus, as the light emitting part 141 and the light receiving part 142 are respectively disposed at the both sides of the movement path of the end-effector 110 in an exemplary embodiment, the deflection of the end-effector 110 may be effectively sensed by using the optical sensing method instead of being interfered by movement of the end-effector 110.

Figure 2:
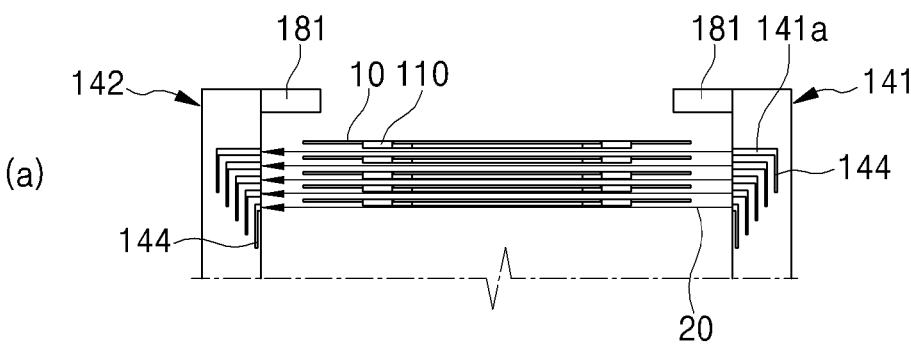
FIG. 2 is a conceptual view for explaining deflection sensing of the end-effector in accordance with an exemplary embodiment.
Figure 2:
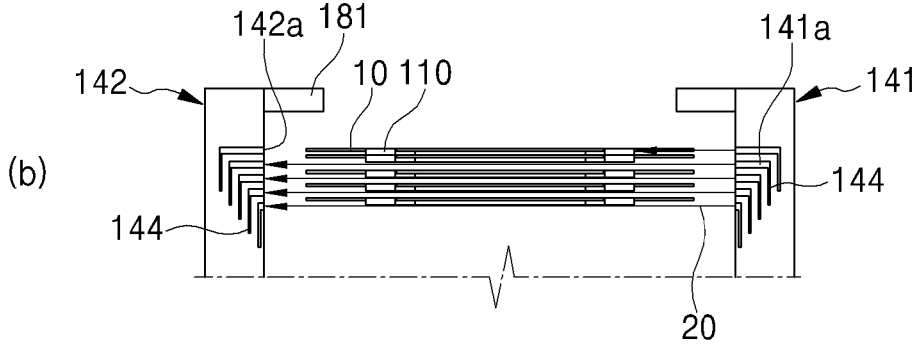
Figure 2:
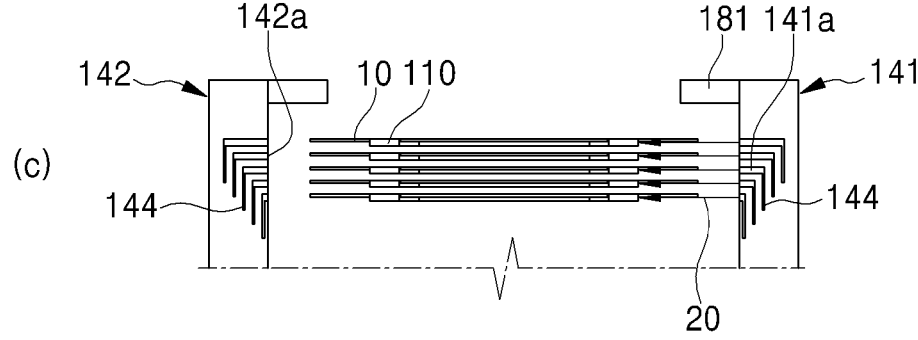
Figure 2:
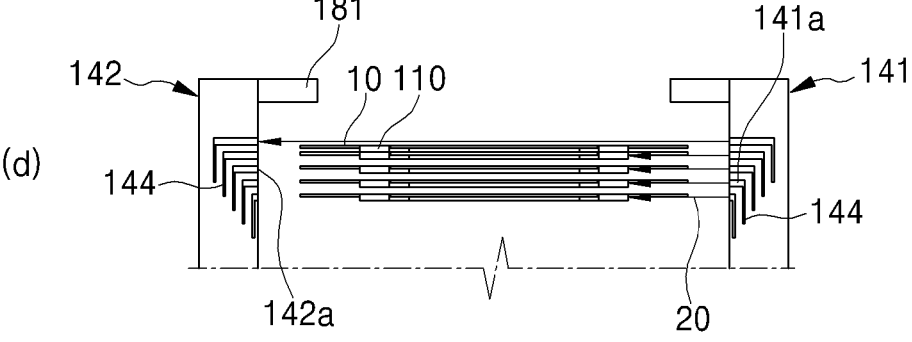

FIG. 2 is a conceptual view for explaining deflection sensing of the end-effector in accordance with an exemplary embodiment, (a) of FIG. 2 illustrates the normal state of the always non-sensing method, (b) of FIG. 2 illustrates a deflected state of the always non-sensing method, (c) of FIG. 2 illustrates the normal state of the always sensing method, and (d) of FIG. 2 illustrates a deflected state of the always sensing method.

Referring to FIG. 2, the end-effector 110 may be provided in plurality and arranged in multiple stages, and the light emitting part 141 may include a plurality of light sources 141*a* corresponding to the plurality of end-effectors 110.

The end-effector 110 may be provided in plurality, and the plurality of end-effectors 110 may be stacked in a vertical direction and arranged in multiple stages. Through this, two or more substrates 10 corresponding to the number of the end-effectors 110 may be transferred at once.

Here, the light emitting part 141 may include the plurality of light sources 141*a* that emit (or irradiate) the straight light 20, and the plurality of light sources 141*a* may be provided in correspondence to the plurality of end-effectors 110. That is, one light source 141*a* may be provided for one end-effector 110, and the number of the light sources 141*a* may be equal to that of the end-effectors 110. For example, each of the plurality of light sources 141*a* may be an optical fiber or laser. Here, the light receiving part 142 may have light receiving surfaces 142*a* with the number corresponding (or equal) to that of the plurality of light sources 141*a*, or one light receiving surface 142*a* may receive straight light 20 irradiated from the plurality of light sources 141*a*. Although the light receiving part 142 may have a plurality of light receiving surfaces 142*a* corresponding to the plurality of light sources 141*a* to effectively sense the deflection of the end-effector 110, the exemplary embodiment is not limited thereto.

For example, the deflection sensing unit 140 may determine abnormality of a pitch p between the plurality of end-effectors 110 by sensing the deflection of the end-effector 110 in the always non-sensing method using the plurality of light sources 141*a* as in (a) of FIG. 2 and (b) of FIG. 2. Alternatively, the deflection sensing unit 140 may determine the abnormality of the pitch between the plurality of end-effectors 110 by sensing the deflection of the end-effector 110 in the always sensing method using the plurality of light sources 141*a* as in (c) of FIG. 2 and (d) of FIG. 2.

Thus, when the plurality of end-effectors 110 are arranged in multiple stages, the abnormality of the pitch between the plurality of end-effectors 110 may be determined by sensing the deflection of the end-effector 110. Thus, the damage of the substrate 10 and/or the falling of the substrate boat 210 caused by an inappropriate pitch between the plurality of end-effectors 110 may be prevented, and also two or more substrates 10 may be stably stacked on the substrate boat 210 having a fixed substrate stacking pitch. Here, as the light emitting part 141 includes the plurality of light sources 141*a* in correspondence to the plurality of end-effectors 110, the deflection of each of the end-effectors 110 may be effectively sensed.

Figure 3:
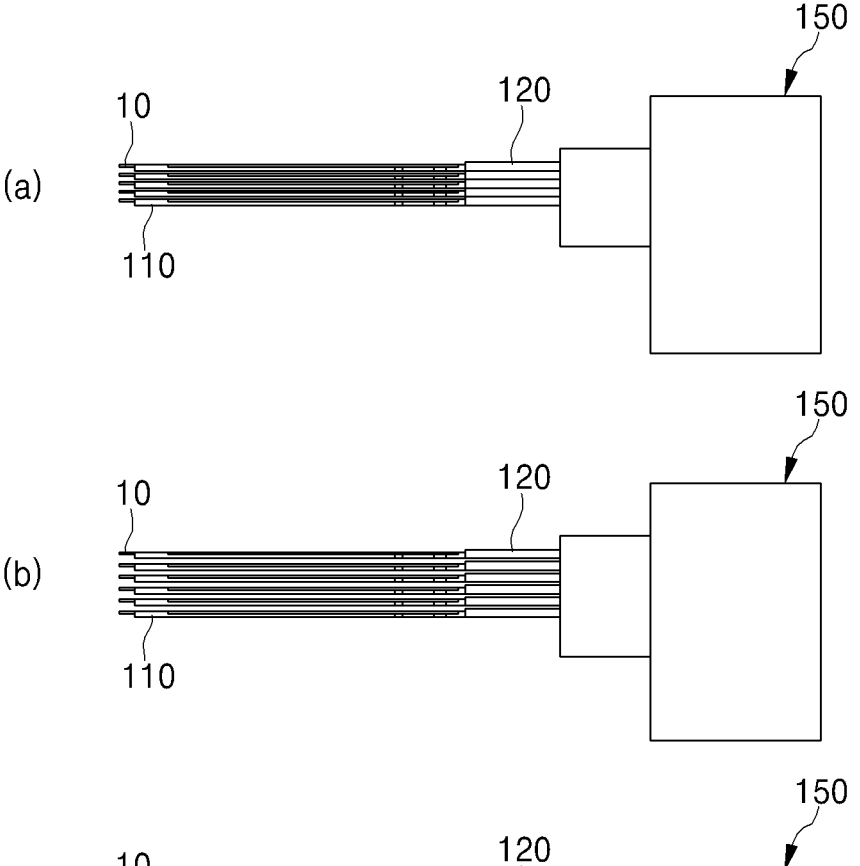
FIG. 3 is a schematic cross-sectional view for explaining a pitch adjustment unit in accordance with an exemplary embodiment.

FIG. 3 is a schematic cross-sectional view for explaining a pitch adjustment unit in accordance with an exemplary embodiment, (a) of FIG. 3 illustrates a narrow pitch between the end-effectors, (b) of FIG. 3 illustrates an intermediate pitch between the end-effectors, and (c) of FIG. 3 illustrates a wide pitch between the end-effectors.

Referring to FIG. 3, the substrate transfer device 100 in accordance with an exemplary embodiment may further include a pitch adjustment unit 150 connected with the end-effector hand 120 and adjusting the pitch between the plurality of end-effectors 110.

The pitch adjustment unit 150 may be connected with the end-effector hand 120 and adjust the pitch between the plurality of end-effectors 110. The substrate stacking pitch of the substrate boat 210 may be varied according to a process performed in a substrate processing apparatus 200 and/or a configuration (or structure) of the substrate boat 210. Here, two or more substrates 10 may be stably stacked at once in correspondence to various substrate boats 210 having different substrate stacking pitches through the pitch adjustment unit 150.

Also, a substrate storing pitch of a substrate storage member 50 may be different from the substrate stacking pitch of the substrate boat 210. Even in this case, two or more substrates 10 may be taken out at once from the substrate storage member 50 by adjusting the pitch of the plurality of end-effectors 110 suitably to the substrate storing pitch of the substrate storage member 50 through the pitch adjustment unit 150. Thereafter, the two or more substrates 10 taken out from the substrate storage member 50 may be stacked at once by adjusting the pitch of the plurality of end-effectors 110 suitably to the substrate stacking pitch of the substrate boat 210. On the contrary, two or more processed substrates 10 may be removed from the substrate boat 210 by adjusting the pitch of the plurality of end-effectors 110 suitably to the substrate storing pitch of the substrate boat 210 through the pitch adjustment unit 150. Thereafter, the processed substrates 10 may be stored in the substrate storage member 50 by adjusting the pitch of the plurality of end-effectors 110 suitably to the substrate storing pitch of the substrate storage member 50.

Thus, the pitch of the plurality of end-effectors 110 may be adjusted through the pitch adjustment unit 150 to correspond to various substrate boats 210 having different substrate stacking pitches and correspond to a case when the substrate storing pitch of the substrate storage member 50 is different from the substrate stacking pitch of the substrate boat 210.

Figure 4:
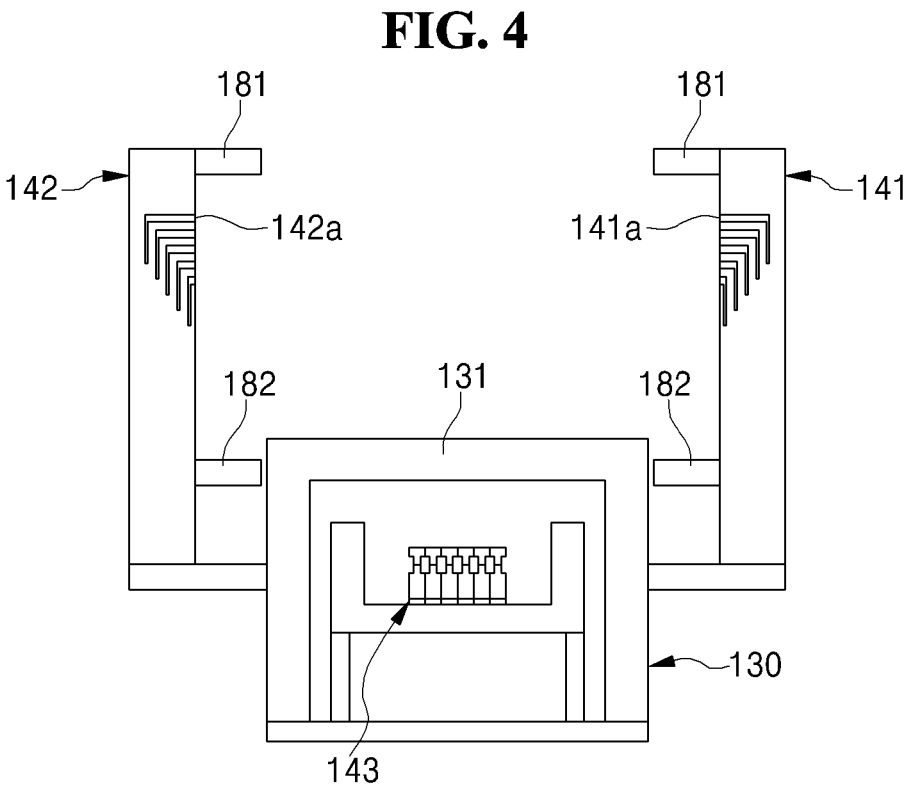
FIG. 4 is a schematic cross-sectional view illustrating a light quantity measurement part in accordance with an exemplary embodiment.

FIG. 4 is a schematic cross-sectional view illustrating a light quantity measurement part in accordance with an exemplary embodiment.

Referring to FIG. 4, the deflection sensing unit 140 may further include: a light quantity measurement part 143 for measuring a light quantity received by the light receiving part 142; and an abnormality determination part (not shown) for determining abnormality of the pitch between the plurality of end-effectors 110 based on the measured light quantity. The light quantity measurement part 143 may measure the light quantity received by the light receiving part 142 and check an on/off state that determines whether the straight light 20 is received by the light receiving part 142 as well as a quantity (or an amount) in which the end-effector 110 blocks the straight light 20 by the deflection of the end-effector 110. Also, the number of abnormal end-effectors 110 may be checked by using a total light quantity received by the light receiving part 142 when light is irradiated from the plurality of light sources 141*a*.

The abnormality determination part (not shown) may determine the abnormality of the pitch between the plurality of end-effectors 110 based on the light quantity measured by the light quantity measurement part 143. The abnormality determination part may determine the abnormality of the pitch between the plurality of end-effectors 110 when the light quantity measured by the light quantity measurement part 143 is different by a predetermined quantity from a normal quantity (or a normal state).

For example, the abnormality determination part may determine the abnormality of the pitch between the plurality of end-effectors 110 when the light quantity measured by the light quantity measurement part 143 is different by 100% from the normal quantity. Also, the abnormality determination part may determine the abnormality of the pitch between the plurality of end-effectors 110 when the light quantity measured by the light quantity measurement part 143 is different by 50% from the normal quantity. Here, the predetermined quantity may be determined as a quantity suitable for exactly determining the abnormality of the pitch between the plurality of end-effectors 110.

In general, when the abnormality of the pitch between the plurality of end-effectors 110 is generated, the end-effector 110 may completely block the straight light 20, and when a slight error is generated due to circumstances, the end-effector 110 may be deflected slightly more or less than a position of the straight light 20. When the end-effector 110 may be deflected slightly more or less than the position of the straight light 20, a portion of the total light quantity of the straight light 20 may be received by the light receiving part 142. In this case, when the abnormality of the pitch between the plurality of end-effectors 110 is determined by only on/off of the straight light 20, the case in which a slight error is generated due to circumstances may not be determined as the abnormality of the pitch between the plurality of end-effectors 110.

On the contrary, when the abnormality of the pitch between the plurality of end-effectors 110 is determined although the light quantity measured by the light quantity measurement part 143 is slightly changed, even non-abnormality of the pitch between the plurality of end-effectors 110 may be determined as the abnormality of the pitch between the plurality of end-effectors 110. That is, since slight light quantity change may be generated even by the slight deflection of the end-effector 110 caused by a load of the substrate 10 or slight shaking caused by movement of the end-effector 110, even the non-abnormality of the pitch between the plurality of end-effectors 110 may be determined as the abnormality of the pitch between the plurality of end-effectors 110. Accordingly, although a case in which the light quantity measured by the light quantity measurement part 143 is changed by 50% (i.e., 50% of the light quantity of the straight light) or more may be determined as the abnormality of the pitch between the plurality of end-effectors 110, the exemplary embodiment is not limited thereto.

Also, although the slight deflection of the end-effector 110 is generated, the substrate 10 may be transferred according to the substrate stacking pitch of the substrate boat 210 and/or the substrate storing pitch of the substrate storage member 50. Here, when the substrate stacking pitch of the substrate boat 210 and/or the substrate storing pitch of the substrate storage member 50 are/is wide, the substrate 10 may be stacked or stored because the substrate 10 is stacked or stored without difficulty although the slight deflection of the end-effector 110 is generated. However, when the substrate stacking pitch of the substrate boat 210 and/or the substrate storing pitch of the substrate storage member 50 are/is narrow, even the slight deflection of the end-effector 110 is required to be determined as the abnormality of the pitch between the plurality of end-effectors 110 because the slight deflection of the end-effector 110 may easily cause the damage of the substrate 10 such as scratches.

Thus, the predetermined quantity may be determined according to the substrate stacking pitch of the substrate boat 210 and/or the substrate storing pitch of the substrate storage member 50. For example, the predetermined quantity may decrease as the substrate stacking pitch of the substrate boat 210 and/or the substrate storing pitch of the substrate storage member 50 decrease or increases as the substrate stacking pitch of the substrate boat 210 and/or the substrate storing pitch of the substrate storage member 50 increase in proportional to the substrate stacking pitch of the substrate boat 210 and/or the substrate storing pitch of the substrate storage member 50.

Thus, whether the substrate 10 is transferable may be exactly determined according to the substrate stacking pitch of the substrate boat 210 and/or the substrate storing pitch of the substrate storage member 50 such that the deflection sensing unit 140 measures the light quantity received by the light receiving part 142 through the light quantity measurement part 143 to determine the abnormality of the pitch between the plurality of end-effectors 110.

Also, maintenance of the end-effector 110 may be determined according to the light quantity measured by the light quantity measurement part 143. The deflection of the end-effector 110 may be generated by breakage of the end-effector 110 made of a ceramic material or loosening of a bolt for coupling the end-effector 110 and the end-effector hand 120. Here, the deflection of the end-effector 110 may have different deflection inclination (or angle) according to causes of the deflection, and the causes of the deflection may be known by difference in light quantity received by the light receiving part 142 caused by difference in deflection inclination. While the end-effector 110 is required to be replaced when the end-effector 110 is broken, the bolt is required to be tightened when the bolt is loosened. Thus, the transfer of the substrate 10 may be temporarily stopped, and the maintenance of the end-effector 110 may be performed. Also, when the deflection is generated by the loosening of the bolt, the deflection gradually increases according to a degree of the loosening of the bolt. Thus, after the end-effector 10 is deflected more than a predetermined inclination (or a predetermined angle), the maintenance of the end-effector 10 may be determined. Here, the inclination of the deflection may be obtained through calculation using the light quantity measured by the light quantity measurement part 143.

As the substrate transfer device 100 in accordance with an exemplary embodiment further includes a deflection compensation part (not shown) for compensating the deflection of the end-effector 110, the end-effector 110 may be (continuously) used until the predetermined inclination while compensating the deflection of the end-effector 110 through the deflection compensation part (not shown) although the end-effector 110 is deflected. Also, the maintenance of the end-effector 110 may be performed when the deflection of the end-effector 110 exceeds the predetermined inclination while the end-effector 110 is used by compensating the defection thereof through the deflection compensation part (not shown).

The horizontal movement unit 130 may include a support plate 131 extending in the first direction to provide a movement path of the end-effector 110 caused by running of the end-effector hand 120. The support plate 131 may extend in the first direction, provide a running path of the end-effector hand 120, and move the end-effector 110 in the first direction as the end-effector hand 120 runs on the support plate 131. That is, the support plate 131 may provide the movement path of the end-effector 110 caused by the running of the end-effector hand 120 and be supported as the light emitting part 141 and the light receiving part 142 are connected. The light emitting part 141 and the light receiving part 142 may be respectively disposed (or provided) at both sides of the movement path of the end-effector 110. Here, the end-effector hand 120 may run along the running path on the support plate 131 and move the end-effector 110 in the first direction. Here, the end-effector hand 120 may run directly on the support plate 131 in the first direction or run on the support plate 131 in the first direction by running of the pitch adjustment unit 150 connected to the end-effector hand 120.

For example, the horizontal movement unit 130 may enable the end-effector hand 120 and/or the pitch adjustment unit 150 to run in the first direction by a rail. However, the exemplary embodiment is not limited thereto. For example, the support plate 131 may provide the running path of the end-effector hand 120.

Also, the light emitting part 141 and the light receiving part 142 may be respectively connected to both sides of the support plate 131 in the second direction crossing the first direction and supported by the support plate 131. As the light emitting part 141 and the light receiving part 142 are respectively connected to the both sides of the support plate 131 in the second direction crossing the first direction, the movement path of the end-effector 110 (or the running path of the end-effector hand) may be secured, and the end-effector 110 may be moved in the first direction without being interfered by the light emitting part 141 and the light receiving part 142. The light emitting part 141 and the light receiving part 142 may sense the deflection of the end-effector 110 disposed or passing through between the light emitting part 141 and the light receiving part 142. Through this, the abnormality of the end-effector 110 due to the deflection may be recognized, and the damage of the substrate 10 and/or the falling of the substrate boat 210 may be prevented in advance. Also, as the light emitting part 141 and the light receiving part 142 are connected and fixed to the both sides of the support plate 131 in the second direction, the light emitting part 141 and the light receiving part 142 may be stably supported and further effectively sense the deflection of the end-effector 110 without being interfered by the movement of the end-effector 110.

When the deflection of the end-effector 110 is sensed while the end-effector 110 is moved in the first direction and passes through between the light emitting part 141 and the light receiving part 142, even in a case in which the end-effector 110 passes through the straight light 20 while the other side (portion) opposite to one side of the end-effector 110 connected with the end-effector hand 120 is greatly inclined (or deflected), a central portion to the one side (portion) in the first direction of the end-effector 110 may block the straight light 20, and the deflection of the end-effector 110 may be effectively sensed.

Figure 5:
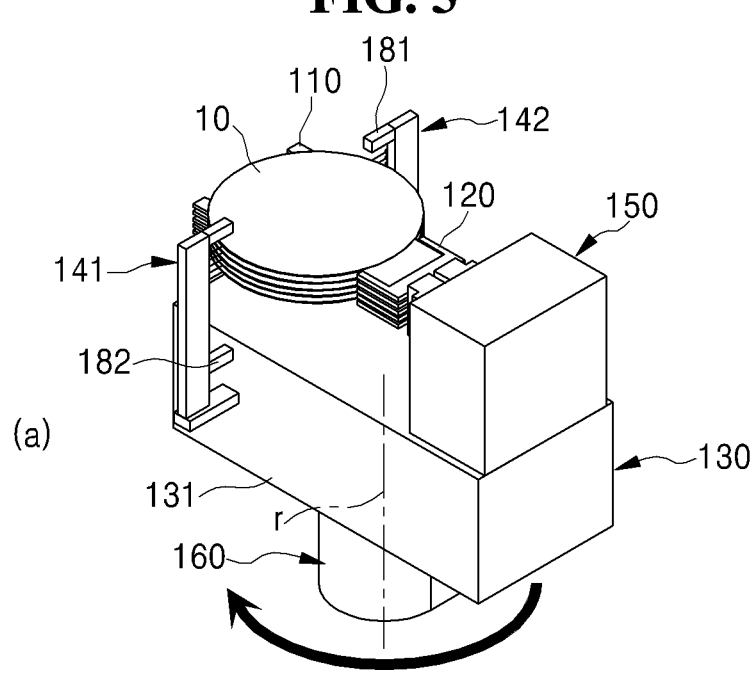
FIG. 5 is a schematic perspective view for explaining a rotation driving unit in accordance with an exemplary embodiment.
Figure 5:
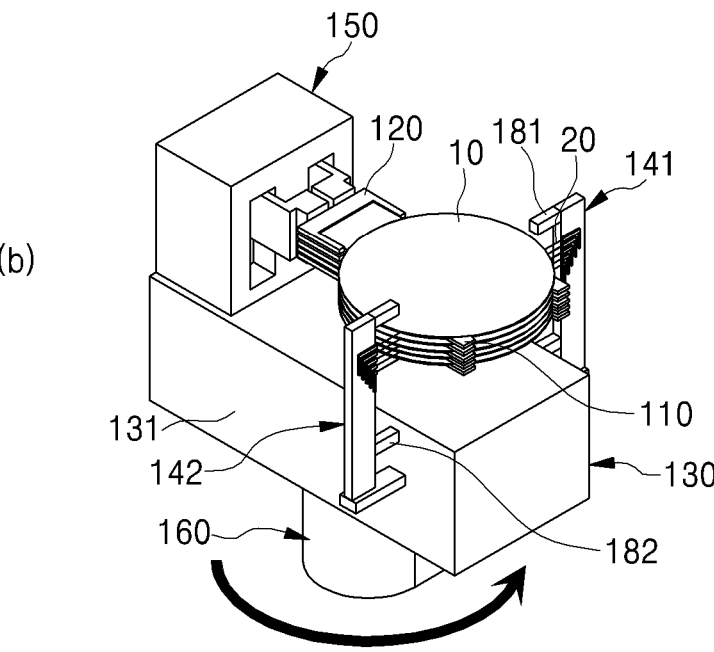

FIG. 5 is a schematic perspective view for explaining a rotation driving unit in accordance with an exemplary embodiment. (a) of FIG. 5 illustrates a right rotation of the support plate, and (b) of FIG. 5 illustrates a left rotation of the support plate.

Referring to FIG. 5, the substrate transfer device 100 in accordance with an exemplary embodiment may further include a rotation driving unit 160 connected with the support plate 131 and rotating the support plate 131 around a rotation axis r.

The rotation driving unit 160 may be connected with the support plate 131 and rotate the support plate 131 around the rotation axis r. For example, the rotation driving unit 160 may rotate the support plate 131 around the rotation axis r in a clockwise direction (or right side) so that the end-effector 110 faces the substrate storage member 50 as in (a) of FIG. 5. Thereafter, the substrate 10 may be taken out from the substrate storage member 50 by moving the end-effector 110 in the first direction. Also, the rotation driving unit 160 may rotate the support plate 131 around the rotation axis r in a counterclockwise direction (or left side) so that the end-effector 110 faces the substrate boat 210 as in (b) of FIG. 5. Thereafter, the substrate 10 taken out from the substrate storage member 50 and supported by the end-effector 110 may be stacked in the substrate boat 210 by moving the end-effector 110 in the first direction.

Also, the substrate boats 210 may be respectively disposed in left and right 45° directions, and the support plate 131 may be rotated to left and right 45° to alternately stack the substrates in two substrate boats 210.

The substrate transfer device 100 in accordance with an exemplary embodiment may further include an elevation unit 170 including an elevation shaft 171 disposed at one side of the support plate 131 in the first direction and elevating the rotation driving unit 160 along the elevation shaft 171.

The elevation unit 170 may include an elevation shaft 171 disposed at one side of the support plate 131 in the first direction and elevate the rotation driving unit 160 along the elevation shaft 171. The substrate boat 210 may have a long vertical length (or height), and a plurality of substrates 10 more than the substrates 10 transferred by the plurality of end-effectors 110 may be stacked in the substrate boat 210 in multiple stages. Here, the end-effector 110 may be elevated together with the rotation driving unit 160 by elevating the rotation driving unit 160 connected with the end-effector 110 by the support plate 131 in order to stack the plurality of substrates 10 in the substrate boat 210 having the long vertical length in multiple stages. Here, the rotation driving unit 160 may be elevated along the elevation shaft 171.

Here, the elevation shaft 171 may be provided at one side of the support plate 131 in the first direction in a non-rotation state (or a state that is not rotated), vertically stand, and connected with the rotation driving unit 160 to be elevated.

Here, the rotation axis r may be spaced apart from the elevation shaft 171. For example, the rotation axis r may be spaced toward the other side in the first direction. As the light emitting part 141 and the light receiving part 142 are respectively connected to the both sides of the support plate 131 in the second direction, the light emitting part 141 or the light receiving part 142 may be interfered by the elevation shaft 171 while the support plate 131 is rotated. Due to this, the rotation axis r may be spaced sufficiently apart from the elevation shaft 171 toward the other side in the first direction. Through this, the feature in which the light emitting part 141 and/or the light receiving part 142 are/is interfered by the elevation shaft 171 due to the rotation of the support plate 131 may be prevented. Thus, the deflection of the end-effector 110 may be sensed even in a rotation state of the support plate 131, and the deflection of the end-effector 110 may be real-time sensed instantly while the substrate 10 is transferred between the substrate storage member 50 and the substrate boat 210.

Also, the light emitting part 141 and the light receiving part 142 may be disposed at a central portion of the support plate 131 to the other side opposite to the one side in the first direction of the support plate 131. One side of the end-effector 110 connected with the end-effector hand 120 is disposed at the one side in the first direction of the support plate 131. Since the one side of the end-effector 110 is connected with the end-effector hand 120, the deflection (or inclination) of the end-effector 110 is not greatly generated. Thus, when the light emitting part 141 and the light receiving part 142 are disposed at the one side in the first direction of the support plate 131, the deflection abnormality of the end-effector 110 may not be effectively sensed. Also, when the light emitting part 141 and the light receiving part 142 are disposed at the one side in the first direction of the support plate 131, the light emitting part 141 or the light receiving part 142 may be interfered by the elevation shaft 171 while the support plate 131 is rotated as the light emitting part 141 and the light receiving part 142 become close to the elevation shaft 171.

Thus, the light emitting part 141 and the light receiving part 142 may be disposed at the central portion of the support plate 131 to the other side (portion) opposite to the one side in the first direction of the support plate 131 instead of being disposed at the one side in the first direction of the support plate 131.

As described above, in accordance with an exemplary embodiment, as the light emitting part 141 and the light receiving part 142 are respectively connected to the both sides of the support plate 131 of the horizontal movement unit 130, the feature in which the light emitting part 141 and the light receiving part 142 affect the movement of the end-effector 110 may be prevented. Thus, the light emitting part 141 and the light receiving part 142 may not be interfered by the movement of the support plate 131 and/or the end-effector 110 according to a coupling structure of the support plate 131, the rotation driving unit 160, and the elevation unit 170.

The deflection sensing unit 140 may further include a position adjustment part 144 for adjusting a position of at least one of the light emitting part 141 and the light receiving part 142. The position adjustment part 144 may adjust a position (i.e., a position of at least one of the light source of the light emitting part and the light receiving surface of the light receiving part) of at least one of the light emitting part 141 and the light receiving part 142. Through this, the position adjustment part 144 may adjust a position of the straight light 20 and an inclination (or angle) of the straight light 20.

For example, since the pitch of the plurality of end-effectors 110 may be adjusted through the pitch adjustment unit 150, the position of the straight light 20 may be adjusted by adjusting the position of at least one of the light emitting part 141 and the light receiving part 142 according to the adjusted pitch of the plurality of end-effectors 110. Also, the position adjustment part 144 may adjust the position of at least one of the light emitting part 141 and the light receiving part 142 to adjust the inclination of the straight light 20 so as to improve a sensing performance on the deflection of the end-effector 110.

In general, as heights of the light emitting part 141 and the light receiving part 142 (i.e., heights of the light source of the light emitting part and the light receiving surface of the light receiving part) are equally adjusted, the light emitting part 141 may horizontally irradiate light to form the horizontal straight light 20. In order to maintain this, the positions of the light emitting part 141 and the light receiving part 142 may be simultaneously adjusted. However, the exemplary embodiment is not limited thereto.

Also, the deflection sensing part 140 may further include an irradiation angle adjustment part (not shown) for adjusting an irradiation angle of the light emitting part 141. The irradiation angle adjustment part (not shown) may adjust the irradiation angle of the light emitting part 141. The irradiation angle adjustment part (not shown) may adjust the irradiation angle of the light emitting part 141 obliquely to a direction horizontally crossing the first direction. Here, a position of the light receiving surface 142a of the light receiving part 142 may be adjusted, or only a position of the straight light 20 incident to the wide light receiving surface 142a may be changed. That is, the straight light 20 irradiated from the light emitting part 141 toward the light receiving part 142 may be oblique to the direction horizontally crossing the first direction.

Since the straight light 20 has a small size or width, the end-effector 110 may pass the straight light 20 by deflection, and the deflection of the end-effector 110 may not be sensed. Due to this, as the straight light 20 is oblique to the direction horizontally crossing the first direction, a range of sensing the deflection of the end-effector 110 may expand (or increase), and the sensing performance on the deflection of the end-effector 110 may be improved.

Here, the straight light 20 may be inclined to a vertical direction, and a height difference between the light emitting part 141 and the light receiving part 142 (or a height difference between a start point and an end point of the straight light) may be equal to or less than a thickness of the end-effector 110. When the inclination of the straight light 20 increases, the range of sensing the deflection of the end-effector 110 may increase. However, when the deflection of the end-effector 110 has the same inclination as that of the straight light 20, the deflection of the end-effector 110 may not be sensed. Thus, the inclination of the straight light 20 may be restricted.

Thus, the height difference between the light emitting part 141 and the light receiving part 142 (or the height difference between the light source of the light emitting part and the light receiving surface of the light receiving part) may be equal to or less than the thickness of the end-effector 110. In this case, the range of sensing the deflection of the end-effector 110 may expand until the thickness of the end-effector 110, and also the case in which the deflection of the end-effector 110 is not sensed because the deflection of the end-effector 110 has the same inclination as that of the straight light 20 may not be generated within the thickness of the end-effector 110.

Figure 6:
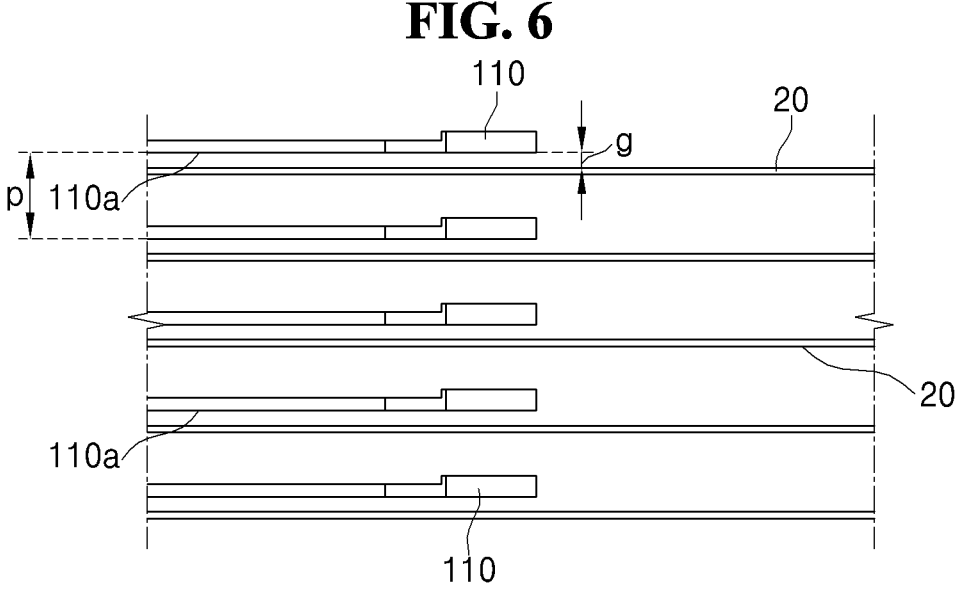
FIG. 6 is a conceptual view for explaining spacing of straight light irradiated from a light emitting part in accordance with an exemplary embodiment.

FIG. 6 is a conceptual view for explaining spacing of the straight light irradiated from the light emitting part in accordance with an exemplary embodiment.

Referring to FIG. 6, the light emitting part 141 may irradiate the straight light 20 having a minimum distance from a bottom surface 110a of the end-effector 110 in a horizontal state, which is equal to or greater than 20% of the thickness of the end-effector 110. That is, the light emitting part 141 may irradiate the straight light 20, and the straight light 20 may have the minimum distance which is equal to or greater than 20% of the thickness of the end-effector 110. Here, the minimum distance may be a minimum distance from the bottom surface 110a of the end-effector 110 in the horizontal state. For example, the light emitting part 141 may irradiate the straight light 20 spaced by 20% or more of the thickness of the end-effector 110 from the bottom surface 110a of the end-effector 110. Here, a minimum gap g of the straight light 20 from the bottom surface 110a of the end-effector 110 in the vertical direction may be 20% or more of the thickness of the end-effector 110. Here, an upper limit of the gap g of the straight light 20 may not be greater than the pitch p of the plurality of end-effectors 110. In case of only one end-effector 110, the upper limit of the gap g of the straight light 20 may not be greater than the length in the first direction of the end-effector 110 and/or the length from the bottom surface 110a of the end-effector 110 to a top surface of the support plate 131.

When the straight light 20 is not spaced by 20% or more of the thickness of the end-effector 110 in the vertical direction from the bottom surface 110a of the end-effector 110, the deflection sensing unit 140 may determine the deflection abnormality of the end-effector 110 even by the slight deflection of the end-effector 110 caused by the load of the substrate 10 or the slight shaking caused by the movement of the end-effector 110. However, this may be prevented when the light emitting part 141 irradiate the straight light 20 having the minimum distance which is equal to or greater than 20% or more of the thickness of the end-effector 110, from the bottom surface 110a of the end-effector 110 in the horizontal state, and further effectively sense (or determine) the deflection abnormality of the end-effector 110 in accordance with an exemplary embodiment.

For example, the end-effector 110 may be deflected less than 0.5 mm by the load of the substrate 10, and the minimum gap g of the straight light 20 in the vertical direction from the bottom surface 110a of the end-effector 110 may be equal to or greater than 0.5 mm. Here, the substrate 10 may have a thickness of about 0.8 mm, and the end-effector 110 may have a thickness of about 1.8 mm.

Thus, in an exemplary embodiment, as the straight light 20 irradiated from the light emitting part 141 toward the light receiving part 142 is spaced by 20% or more of the thickness of the end-effector 110 from the bottom surface 110a of the end-effector 110 in the horizontal state, the feature in which the slight deflection of the end-effector 110 caused by the load of the substrate 10 is determined as the abnormality of the end-effector 110 may be prevented.

The substrate transfer device 100 in accordance with an exemplary embodiment may further include a substrate sensing unit 180 including one pair of a transmitter 181 and a receiver 182 and sensing the substrate 10 supported by the end-effector 110.

The substrate sensing unit 180 may sense the substrate 10 supported by the end-effector 110 and include one pair of the transmitter 181 and the receiver 182. The transmitter 181 and the receiver 182 may be paired with each other and transceive light or an ultrasonic wave. For example, the substrate 10 may be sensed as the transmitter 181 irradiates light, and the receiver 182 receives the light. When the light is not received by the receiver 182, it is determined that the substrate 10 is supported by the end-effector 110, and when the light is received by the receiver 182, it is determined that the substrate 10 is not supported by the end-effector 110.

Here, the transmitter 181 and the receiver 182 may be vertically spaced apart from each other, and one pair of the transmitter 181 and the receiver 182 may be provided at each of both sides in a second direction 12 of the support plate 131. For example, one pair of the transmitter 181 and the receiver 182 may be connected and supported (or fixed) to each of the light emitting part 141 and the light receiving part 142. As one pair of the transmitter 181 and the receiver 182 is provided at each of the both sides in the second direction 12 of the support plate 131, whether the substrate 10 is supported on the end-effector 110 and whether the substrate 10 is supported at a regular position may be recognized.

Figure 7:
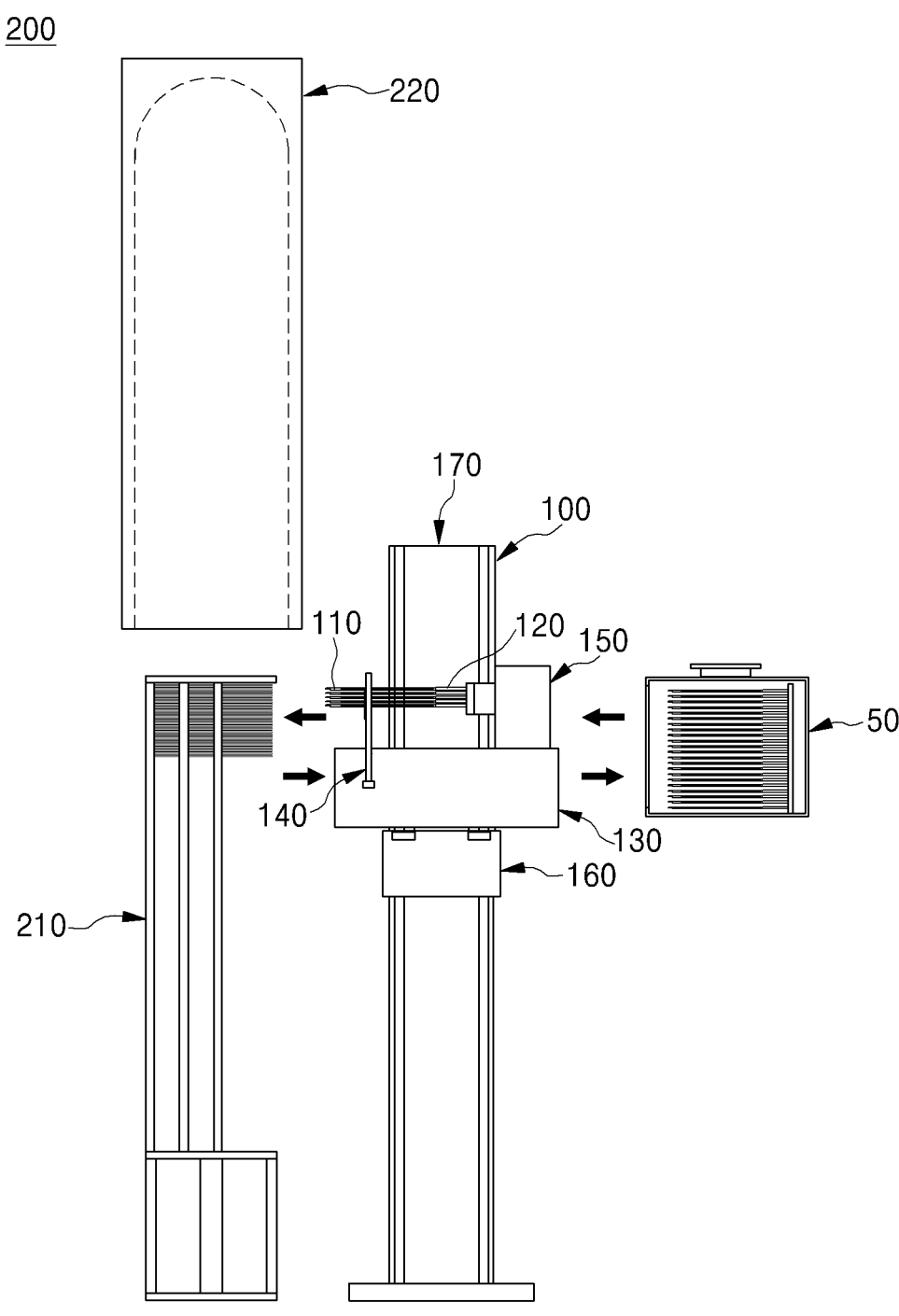
FIG. 7 is a schematic cross-sectional view illustrating a substrate processing apparatus in accordance with another exemplary embodiment.

FIG. 7 is a schematic cross-sectional view illustrating a substrate processing apparatus in accordance with another exemplary embodiment.

The substrate processing apparatus in accordance with another exemplary embodiment will be described with reference to FIG. 7. In the description of the substrate processing apparatus in accordance with another exemplary embodiment, descriptions overlapped with the substrate processing apparatus in accordance with an exemplary embodiment will be omitted.

A substrate processing apparatus 200 in accordance with another exemplary embodiment may include: a substrate transfer device 100; a substrate boat 210 in which the substrates 10 supported by the end-effector 110 are transferred and stacked in multiple stages; and a process tube 220 having an inner space in which the substrate boat 210 is accommodated.

The substrate transfer device 100 may be the substrate transfer device 100 in accordance with an exemplary embodiment and transfer the substrate between the substrate storage member 50 and the substrate boat 210. The detailed description on the substrate transfer device 100 is described above and will be omitted.

The plurality of substrates 10 may be stacked in the substrate boat 210 in multiple stages (or in the vertical direction) to perform a process in a batch type manner. The substrate boat 210 may be elevated to stack the substrates or perform a processing process. For example, the substrate boat 210 may stack 22 sheets of substrates 10 in multiple stages. While the substrate boat 210 is positioned in a stacking space (or a stacking position) disposed below the process tube 220, the substrate 10 may be stacked in the substrate boat 210. More specifically, when one or more substrates 10 is stacked in the substrate boat 210 by the substrate transfer device 100, the substrate boat 210 or the end-effector 110 may be lifted, and the substrate 10 may be stacked below or above the stacked substrate 10. When all of the plurality of substrates 10 are stacked in the substrate boat 210, the substrate boat 210 may be moved to an accommodation space (or process position) of the process tube 220 so that the substrate processing process is performed in the accommodation space of the process tube 220. Here, the substrate boat 210 may be made of ceramic such as silicon carbide (SiC), quartz, and synthetic quartz.

An accommodation space in which the substrate boat 210 is accommodated may be defined in the process tube 220 to perform the processing process on the substrate 10 stacked in the substrate boat 210. The process tube 220 may have a cylindrical shape. Also, the process tube 220 may have an opened lower portion and a closed upper portion. Through this, when the substrate boat 210 is vertically elevated to be positioned in the accommodation space of the process tube 220, the substrate boat 210 may be inserted into or withdrawn from the accommodation space of the process tube 220 through a lower opening of the process tube 220. Here, the process tube 220 may be a single tube or a plurality of tubes including an outer tube and an inner tube.

Also, the substrate transfer device 100 may be disposed between the substrate storage member 50 in which the plurality of substrates 10 are accommodated and the substrate boat 210 to transfer the substrates 10 between the substrate storage member 50 and the substrate boat 210. Here, the substrate transfer device 100 may be disposed between the substrate boat 210 and a load port such as a front-opening interface mechanical standard (FIMS) to transfer the substrates 10 between the substrate boat 210 and the substrate storage member 50 that is opened at the load port. For example, the substrate transfer device 100 may be disposed (or positioned) between the substrate boat 210 and the substrate storage member 50 disposed at the load port. The substrate storage member 50 may be disposed at the left side of the substrate transfer device 100, and the substrate boat 210 may be disposed at the right side of the substrate transfer device 100. Here, the end-effector 110 may face the substrate storage member 50 by rotating the support plate 131 in the counterclockwise direction (or left side). Thereafter, the end-effector 110 may be moved in the first direction to take out the substrate 10 from the substrate storage member 50. Also, the end-effector 110 may face the substrate boat 210 by rotating the support plate 131 in the clockwise direction (or right side). Thereafter, the end-effector 110 may be moved in the first direction to stack the substrate 10, which is taken out from the substrate storage member 50 and supported by the end-effector 110, in the substrate boat 210. On the contrary, the end-effector 110 may face the substrate boat 210 by rotating the support plate 131 in the clockwise direction (or right side). Thereafter, the end-effector 110 may be moved in the first direction to remove the substrate 10, which is completely processed, from the substrate boat 210. Also, the end-effector 110 may face the substrate storage member 50 by rotating the support plate 131 in the counterclockwise direction. Thereafter, the end-effector 110 may be moved in the first direction to store the substrate 10, which is completely processed and supported by the end-effector 110, in the substrate storage member 50.

Here, the substrate stacking pitch of the substrate boat 210 may be different from the substrate storing pitch of the substrate storage member 50. In this case, two or more substrates 10 may be taken out at once from the substrate storage member 50 by adjusting the pitch of the plurality of end-effectors 110 suitably to the substrate storing pitch of the substrate storage member 50 through the pitch adjustment unit 15. Thereafter, the two or more substrates 10 taken out from the substrate storage member 50 may be stacked at once by adjusting the pitch of the plurality of end-effectors 110 suitably to the substrate stacking pitch of the substrate boat 210. On the contrary, two or more processed substrates 10 may be removed from the substrate boat 210 by adjusting the pitch of the plurality of end-effectors 110 suitably to the substrate storing pitch of the substrate boat 210 through the pitch adjustment unit 150. Thereafter, the processed substrates 10 may be stored in the substrate storage member 50 by adjusting the pitch of the plurality of end-effectors 110 suitably to the substrate storing pitch of the substrate storage member 50.

As described above, in accordance with an exemplary embodiment, as the deflection of the end-effector is sensed through the deflection sensing unit, the abnormality of the end-effector may be recognized before the substrate is transferred, and the damage of the substrate caused by the transfer failure of the end-effector and/or the falling of the substrate boat may be prevented in advance. Here, the deflection sensing unit may include the light emitting part and the light receiving part, which are respectively disposed at the both sides of the movement path of the end-effector, to effectively sense the deflection of the end-effector without being interfered by the movement of the end-effector. Also, when the plurality of end-effectors are arranged in multiple stages, the abnormality of the pitch between the plurality of end-effectors may be determined by sensing the deflection of the end-effector. Accordingly, the damage of the substrate caused by the abnormality of the pitch between the plurality of end-effectors and/or the falling of the substrate boat may be prevented, and two or more substrates may be stably stacked at once in the substrate boat having the determined substrate stacking pitch. Here, as the light emitting part includes the plurality of light sources corresponding to the plurality of end-effectors, the deflection of each of the plurality of end-effectors may be effectively sensed. Also, various substrate boats having different substrate stacking pitches may be adapted by adjusting the pitch of the plurality of end-effectors through the pitch adjustment unit. Also, as the deflection sensing unit measures the light quantity received by the light receiving part to determine the abnormality of the pitch between the plurality of end-effectors, whether the substrate is transferable may be exactly determined according to the substrate stacking pitch of the substrate boat and/or the substrate storing pitch of the substrate storage member. Here, the feature in which the slight deflection of the end-effector caused by the load of the substrate is recognized as the abnormality may be prevented by allowing the straight light irradiated from the light emitting part toward the light receiving part to be spaced by at least 20% or more of the thickness of the end-effector from the bottom surface of the end-effector in the horizontal state. Also, as the light emitting part and the light receiving part are respectively connected to the both sides of the support plate of the horizontal movement unit, the light emitting part and the light receiving part may not affect the movement of the end-effector, and the light emitting part and the light receiving part may not be interfered by the movement of the support plate and/or the end-effector according to the coupling structure of the support plate, the rotation driving unit, and the elevation unit.

The substrate transfer device in accordance with an exemplary embodiment may sense the deflection of the end-effector through the deflection sensing unit to recognize the abnormality of the end-effector before the substrate is transferred and prevent the damage of the substrate caused by the transfer failure of the end-effector and/or the falling of the substrate boat in advance. Here, the deflection sensing unit may include the light emitting part and the light receiving part, which are respectively disposed at the both sides of the movement path of the end-effector, to effectively sense the deflection of the end-effector without being interfered by the movement of the end-effector.

Also, when the plurality of end-effectors are arranged in multiple stages, the abnormality of the pitch between the plurality of end-effectors may be determined by sensing the deflection of the end-effector. Accordingly, the damage of the substrate caused by the abnormality of the pitch between the plurality of end-effectors and/or the falling of the substrate boat may be prevented, and two or more substrates may be stably stacked at once in the substrate boat having the determined substrate stacking pitch. Here, as the light emitting part includes the plurality of light sources corresponding to the plurality of end-effectors, the deflection of each of the plurality of end-effectors may be effectively sensed.

Also, the various substrate boats having the different substrate stacking pitches may be adapted by adjusting the pitch of the plurality of end-effectors through the pitch adjustment unit. Also, as the deflection sensing unit measures the light quantity received by the light receiving part to determine the abnormality of the pitch between the plurality of end-effectors, whether the substrate is transferable may be exactly determined according to the substrate stacking pitch of the substrate boat and/or the substrate storing pitch of the substrate storage member.

Here, the feature in which the slight deflection of the end-effector caused by the load of the substrate is recognized as the abnormality may be prevented by allowing the straight light irradiated from the light emitting part toward the light receiving part to be spaced by at least 20% or more of the thickness of the end-effector from the bottom surface of the end-effector in the horizontal state.

Also, as the light emitting part and the light receiving part are respectively connected to the both sides of the support plate of the horizontal movement unit, the light emitting part and the light receiving part may not affect the movement of the end-effector, and the light emitting part and the light receiving part may not be interfered by the movement of the support plate and/or the end-effector according to the coupling structure of the support plate, the rotation driving unit, and the elevation unit.

Although the embodiments of the present invention have been described, it is understood that the present invention should not be limited to these embodiments but various changes and modifications can be made by one ordinary skilled in the art within the spirit and scope of the present invention as hereinafter claimed. Hence, the real protective scope of the present invention shall be determined by the technical scope of the accompanying claims.

What is claimed is:

1. A substrate transfer device comprising:
an end-effector extending in a first direction and configured to support a substrate;
an end-effector hand connected with one side in the first direction of the end-effector;
a horizontal movement unit connected with the end-effector hand and configured to move the end-effector in the first direction; and
a deflection sensing unit comprising a light emitting part and a light receiving part, which are respectively disposed at both sides of a movement path of the end-effector, and configured to sense deflection of the end-effector,
wherein the horizontal movement unit comprises a support plate extending in the first direction to provide the movement path of the end-effector caused by running of the end-effector hand, and
the light emitting part and the light receiving part are respectively supported by both sides in a second direction crossing the first direction of the support plate.

2. The substrate transfer device of claim 1, further comprising a rotation driving unit connected with the support plate to rotate the support plate around a rotation axis.

3. The substrate transfer device of claim 2, further comprising an elevation unit comprising an elevation shaft provided at one side in the first direction of the support plate to elevate the rotation driving unit along the elevation shaft,
wherein the rotation shaft is spaced from the elevation shaft to the other side in the first direction.

4. The substrate transfer device of claim 1, wherein the light emitting part and the light receiving part are disposed from a central portion of the support plate to the other side opposite to one side in the first direction of the support plate.

5. The substrate transfer device of claim 1, wherein the deflection sensing unit further comprises a position adjust-ment part configured to adjust a position of at least one of the light emitting part and the light receiving part.

6. The substrate transfer device of claim 1, wherein the deflection sensing unit further comprises an irradiation angle adjustment part configured to adjust an irradiation angle of the light emitting part.

7. The substrate transfer device of claim 1, wherein the light emitting part irradiates straight light having a minimum distance from a bottom surface of the end-effector in a horizontal state, which is 20% or more of a thickness of the end-effector.

8. A substrate processing apparatus comprising:
the substrate transfer device of claim 1;
a substrate boat in which the substrates supported by the end-effector are transferred and stacked in multiple stages; and
a process tube having an inner space in which the substrate boat is accommodated.

9. The substrate processing apparatus of claim 8, wherein the substrate transfer device is disposed between a substrate storage member in which the plurality of substrates are accommodated and the substrate boat to transfer the substrates between the substrate storage member and the substrate boat.

10. A substrate transfer comprising:
an end-effector extending in a first direction and configured to support a substrate;
an end-effector hand connected with one side in the first direction of the end-effector;
a horizontal movement unit connected with the end-effector hand and configured to move the end-effector in the first direction; and
a deflection sensing unit comprising a light emitting part and a light receiving part, which are respectively disposed at both sides of a movement path of the end-effector, and configured to sense deflection of the end-effector,
wherein a plurality of end-effectors are provided and arranged in multiple stages, and
the light emitting part comprises a plurality of light sources corresponding to the plurality of end-effectors.

11. The substrate transfer device of claim 10, further comprising a pitch adjustment unit connected with the end-effector hand and configured to adjust a pitch of the plurality of end-effectors.

12. The substrate transfer device of claim 10, wherein the deflection sensing unit further comprises:
a light quantity measurement part configured to measure a light quantity received by the light receiving part; and
an abnormality determination part configured to determine abnormality of a pitch of the plurality of end-effectors based on the measured light quantity.

* * * * *